United States Patent
Qin

(10) Patent No.: US 8,293,659 B2
(45) Date of Patent: Oct. 23, 2012

(54) METHOD FOR FABRICATING DIELECTRIC LAYER WITH IMPROVED INSULATING PROPERTIES

(75) Inventor: Shu Qin, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/014,562

(22) Filed: Jan. 26, 2011

(65) Prior Publication Data

US 2012/0190213 A1     Jul. 26, 2012

(51) Int. Cl.
    *H01L 21/469* (2006.01)
(52) U.S. Cl. ........ 438/783; 438/788; 438/418; 438/423; 257/E21.247; 257/E21.248
(58) Field of Classification Search .................. 438/783, 438/788, 418, 423; 257/E21.247, E21.248
See application file for complete search history.

(56) References Cited

U.S. PATENT DOCUMENTS

| 4,447,272 | A | * | 5/1984 | Saks | 438/287 |
| 6,143,631 | A | * | 11/2000 | Chapek | 438/513 |
| 2009/0221117 | A1 | * | 9/2009 | Tan et al. | 438/238 |

OTHER PUBLICATIONS

Gueorguiev et al., "Gate oxide conductivity of polysilicon thin film transistors," Proc. 20th International Conference on Microelectronics (MIEL'95), vol. 1, 1995, pp. 149-152.*
Shokrani and Kapoor, "Silicon dioxide with a silicon interfacial layer as an insulating gate for highly stably indium phosphide metal-insulator-semiconductor field effect transistors," J. Electrochem. Soc., vol. 138, 1991, pp. 1788-1794.*

* cited by examiner

*Primary Examiner* — Julia Slutsker

(57) ABSTRACT

A method for fabricating a dielectric layer with improved insulating properties is provided, including: providing a dielectric layer having a first resistivity; performing a hydrogen plasma doping process to the dielectric layer; and annealing the dielectric layer, wherein the dielectric layer has a second resistivity greater than that of the first resistivity after annealing thereof.

17 Claims, 2 Drawing Sheets

METHOD FOR FABRICATING DIELECTRIC LAYER WITH IMPROVED INSULATING PROPERTIES

BACKGROUND OF THE INVENTION

1. Field of the Invention

The present invention relates to semiconductor fabrications, and particularly, relates to a method for fabricating a dielectric layer with improved insulating properties and a method for fabricating a semiconductor structure having a dielectric layer with improved insulating properties.

2. Description of the Related Art

In semiconductor fabrication, various layers of dielectric insulating materials, semiconductor materials and conducting materials are formed to produce a multi-level semiconductor device.

One of the limiting factors of the continued evolution toward smaller device sizes and higher densities of semiconductor devices has been insufficient insulation properties of dielectric insulating materials formed in the semiconductor device for isolating metal interconnects and passive or active components therein, since thickness or space of the dielectric insulating materials is also reduced.

For example, silicon oxide is one of the widely used dielectric insulating materials which function as an insulating layer in applications such as multilevel interconnections, shallow trench isolations (STI), gate spacers, and source or drain contact isolations. A silicon oxide film can be deposited by a thermal chemical vapor deposition (CVD) or plasma-enhanced chemical vapor deposition (PECVD) process. However, after a front-end process of the semiconductor device is completed, a sequentially formed silicon oxide film will be formed under a relatively low temperature (e.g. a temperature not greater than 600° C.) to prevent the devices (e.g. CMOS devices) formed in the front-end process from degrading. This relatively low temperature, however, may degrade insulating properties such as bulk resistivity, leakage current, electrical breakdown voltage and mechanical and chemical stability of the formed silicon oxide while the thickness thereof is further reduced.

Thus, there is a need for a method to fabricate a dielectric layer with improved insulating properties, which allows the thickness of the insulating layer to shrink along with other features such as a metal interconnect line width or a space between adjacent passive/active devices or metal interconnect lines.

BRIEF SUMMARY OF THE INVENTION

A method for fabricating a dielectric layer with improved insulating properties and a method for fabricating a semiconductor structure having a dielectric layer with improved insulating properties are provided.

An exemplary method for fabricating a dielectric layer with improved insulating properties comprises: providing a dielectric layer having a first resistivity; performing a hydrogen plasma doping process to the dielectric layer; and annealing the dielectric layer, wherein the dielectric layer has a second resistivity greater than that of the first resistivity after annealing thereof.

An exemplary method for fabricating a semiconductor structure having a dielectric layer with improved insulating properties comprises: providing a semiconductor substrate with a dielectric layer formed thereover, wherein the dielectric layer has a first resistivity; performing a hydrogen plasma doping process to the dielectric layer; and annealing the dielectric layer, wherein the dielectric layer has a second resistivity, after annealing thereof, that is greater than that of the first resistivity.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
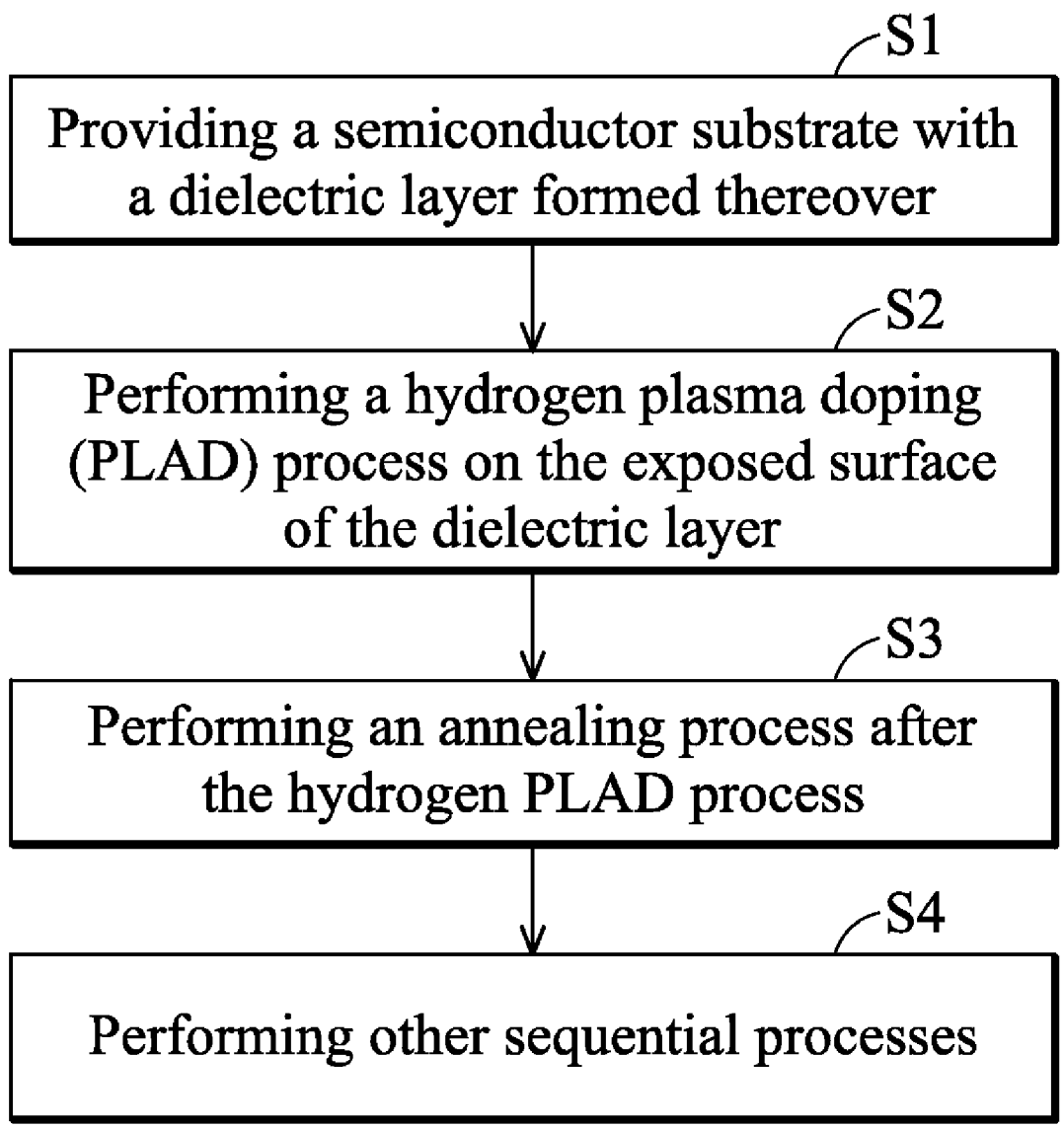
FIG. 1 is a flowchart showing a method for fabricating a semiconductor structure having a dielectric layer with improved insulating properties according to an embodiment of the invention.

In FIG. 1, a flowchart showing an exemplary method for fabricating a semiconductor structure having a dielectric layer with improved insulating properties is illustrated.

In FIG. 1, the method begins at step S1, in which a semiconductor substrate or a semiconductor structure with a dielectric layer formed thereover is provided. The semiconductor substrate can be, for example, silicon substrate. The dielectric layer may function as an insulating layer and may comprise dielectric insulating materials such as silicon oxide, undoped silicate glass (USG), borosilicate glass (BSG), phosphosilicate glass (PSG) or borophorphosilicate glass (BPSG). Methods for fabricating the dielectric layer can be, for example, spin coating, chemical vapor deposition (CVD), or plasma enhanced chemical vapor deposition (PECVD) methods, or the like. A surface of the dielectric layer is exposed, and original insulating properties such as resistivity (p) and breakdown charge ($Q_{BD}$) of the dielectric layer are dependant upon parameters of the method for forming thereof.

Next, at step S2, a hydrogen plasma doping (PLAD) process is performed on the exposed surface of the dielectric layer to improve insulating properties such as resistivity ($\rho$) and breakdown charge ($Q_{BD}$) thereof. The hydrogen PLAD process can be performed by a plasma doping (PLAD) ion implanter rather than the conventional beam-line ion implanter. PLAD ion implanters used herein can be, for example, Varian's VIISta® PLAD and Applied Material's P3i implanters, which are commercially available. In the hydrogen PLAD process, pure hydrogen gas is used as a source gas to dope the dielectric layer with hydrogen atoms at a fixed dosage and at varying implant energies. The dielectric layer may have a thickness, for example, of about 2-500 nm, and the hydrogen plasma doping process can be performed under an implant energy, for example, of about 20-50000 eV and an implant dosage, for example, of about 1e16-1e17/cm². In one embodiment, the implant energy of the hydrogen PLAD process may linearly ramp up in a predetermined interval, for example 2000 eV to 5000 eV, for the hydrogen PLAD process. However, implant dosages, implant times, and implant energies used in the hydrogen PLAD process depend on a thickness of the dielectric layer. For example, in one embodiment, the implant dosage is about 4e16-8e16/cm², the implant time is about 53-98 seconds, and the implant energy is about 2000 eV to 5000 eV while a thickness of the dielectric layer is about 50 nm. In another embodiment, the implant dosage is about, 2e16-4e16/cm², the implant time is about 30-53 seconds, and the implant energy is about 1000 eV to 3000 eV while a thickness of the dielectric layer is about 30 nm. In yet another embodiment, the implant dosage is about 5e16-1e17/cm², the implant time is about 60-100 seconds, and the implant energy is about 2000 eV to 10000 eV while a thickness of the dielectric layer is about 100 nm.

Next, at step S3, an annealing process is performed after the hydrogen PLAD process is completed to uniformly drive the hydrogen atom within the dielectric layer. In one embodiment, the annealing process is performed at a temperature of between 300-600° C. for 30-60 minutes, under an atmosphere of pure $N_2$. The annealing temperature and the process time of the annealing process depend on the implant dosages, implant times and implant energies of the hydrogen PLAD process. After the annealing process, insulating properties such as resistivity ($\rho$) and breakdown charge ($Q_{BD}$) of the dielectric layer formed over the semiconductor structure processed by the hydrogen PLAD process are now higher in quantity than when compared with the original insulating properties prior to processing of the hydrogen PLAD process. For example, a resistivity ($\rho$) of the dielectric being processed by the hydrogen PLAD process and the annealing can be increased by at least 2.2 times to that of the dielectric layer which is not processed by the hydrogen PLAD process and annealed, and a breakdown charge ($Q_{BD}$) of the dielectric being processed by the hydrogen PLAD process and the annealing can be increased by at least 50 times to that of the dielectric layer which is not processed by the hydrogen PLAD process and annealed. Therefore, insulating properties of the dielectric layer processed by the hydrogen PLAD process and the annealing are improved.

Next, at step S4, other processes can be sequentially performed to pattern the dielectric layer or to form other elements or features in or over the dielectric layer, thereby forming a semiconductor structure with the dielectric layer having improved insulating properties capable of a predetermined functionality.

Figure 2A:
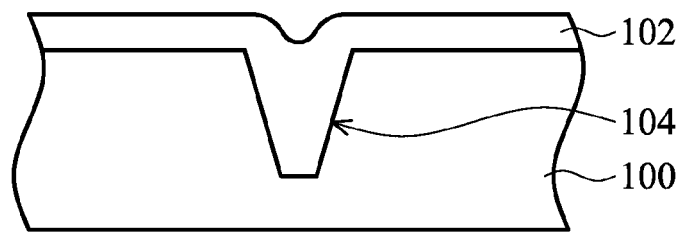
FIGS. 2A, 2B, and 2C are cross-sections showing a semiconductor structure having a dielectric layer with improved insulating properties according to various embodiments of the invention, respectively.
Figure 2B:
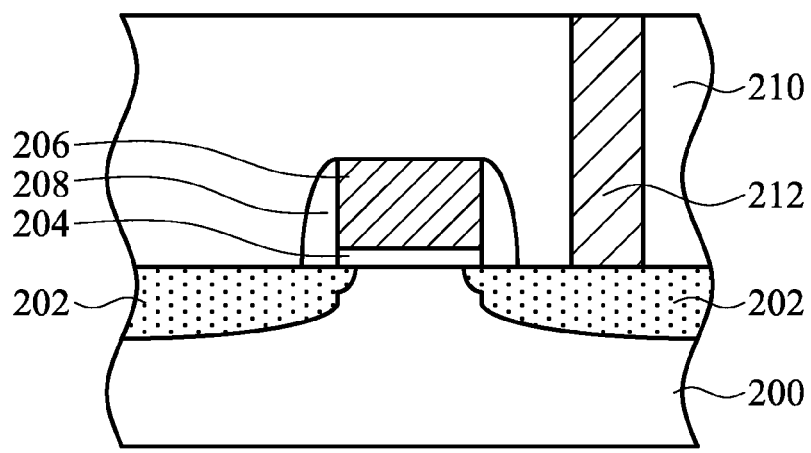
Figure 2C:
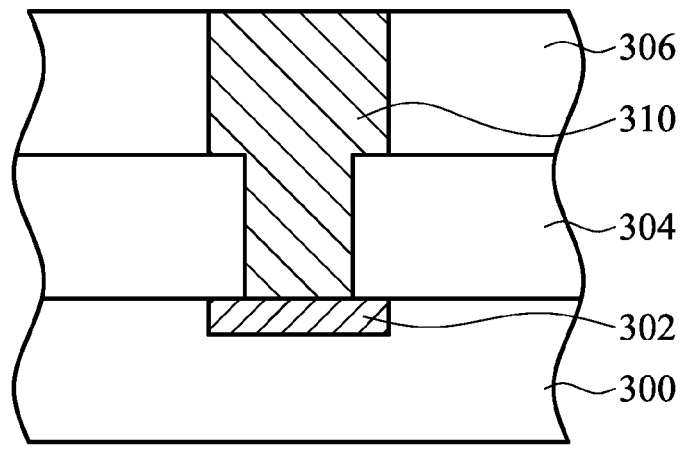

FIGS. 2A, 2B, and 2C are cross-sections showing various semiconductor structures with the dielectric layer having improved insulating properties capable of a predetermined functionality. The various semiconductor structures shown in FIGS. 2A, 2B, and 2C can be fabricated by the method illustrated in FIG. 1, and the various semiconductor structures may comprise a dielectric layer with improved insulating properties formed by the method described in the steps S2-S3 shown in FIG. 1.

As shown in FIG. 2A, an exemplary semiconductor structure comprising a semiconductor substrate 100 having a trench 104 formed therein and a dielectric layer 102 formed thereover is illustrated. The dielectric layer 102 is formed over the semiconductor substrate 100 and fills the trench 104, functioning as an isolation element such as a shallow trench isolation (STI) element. Since the dielectric layer 102 is now formed with improved insulating properties according to the fabrication steps S2-S3 shown in FIG. 1, it is capable of providing sufficient insulation despite the continuing evolution toward smaller device sizes and higher densities, wherein a thickness or an isolation space of the dielectric layer 102 is reduced.

In addition, as shown in FIG. 2B, another exemplary semiconductor structure comprising a semiconductor 200 having source/drain regions 202 formed therein, a gate dielectric layer 204, a gate electrode 206, insulating spacers 208, and a dielectric layer 210 with a conductive contact 212 therein is illustrated. In this embodiment, the insulating spacers 208 functioning as gate spacers and/or the insulating layer 210 functioning as source/drain contact isolations, is formed with improved insulating properties according to the fabrications steps S2-S3 shown in FIG. 1. Thus, the insulating spacers 208 and/or the dielectric layer 210 is capable of providing sufficient insulation despite the continuing evolution toward smaller device sizes and higher densities, wherein a thickness or an isolation space of the insulating spacers 208 and/or the dielectric layer 210 is reduced.

Moreover, as shown in FIG. 2C, yet another exemplary semiconductor structure comprising stacked dielectric layers 300, 304, and 306 formed over a semiconductor substrate (not shown), a conductive element 302 formed in the dielectric layer 300, and an interconnecting element 310 formed in the dielectric layers 304 and 306 is illustrated. In this embodiment, at least one of the dielectric layers 300, 304, and 306 is now formed with improved insulating properties according to the fabrication steps S2-S3 shown in FIG. 1. Thus, the at least one of the dielectric layers 300, 304, and 306 is capable of providing sufficient insulation despite the continuing evolution toward smaller device sizes and higher densities, wherein a thickness or an isolation space of the at least one of the dielectric layers 300, 304, and 306 is reduced.

TABLE 1

Measurement results of insulating properties of a silicon oxide layer formed over a silicon substrate.

| Sample | Implant Type | Energy (eV) | Dosage (atoms/cm²) | Anneal temperature (° C.) | Anneal time (min) | Thickness (nm) | $\rho$ ($\Omega$-cm) | $Q_{BD}$ (C/cm²) |
|---|---|---|---|---|---|---|---|---|
| 1 | None | None | None | None | None | 55.02 | $8.50 \times 10^{14}$ | $3.9 \times 10^{-2}$ |
| 2 | Hydrogen PLAD | 2000-5000 | 4E16 | None | None | 55.27 | $6.84 \times 10^{14}$ | $1.1 \times 10^{-2}$ |
| 3 | Hydrogen PLAD | 2000-5000 | 4E16 | 300° C. | 30 | 53.72 | $1.27 \times 10^{15}$ | None |
| 4 | Hydrogen PLAD | 2000-5000 | 4E16 | 400° C. | 30 | 53.58 | $1.91 \times 10^{15}$ | 1.9 |
| 5 | Hydrogen PLAD | 2000-5000 | 4E16 | 500° C. | 30 | 53.66 | $2.12 \times 10^{15}$ | $2.6 \times 10^{-5}$ |
| 6 | Hydrogen PLAD | 2000-5000 | 8E16 | N/A | None | 54.24 | $4.18 \times 10^{14}$ | $2.3 \times 10^{-3}$ |
| 7 | Hydrogen | 2000- | 8E16 | 300° C. | 30 | 53.27 | $6.82 \times 10^{14}$ | None |

TABLE 1-continued

Measurement results of insulating properties of a silicon oxide layer formed over a silicon substrate.

| Sample | Implant Type | Energy (eV) | Dosage (atoms/cm$^2$) | Anneal temperature (° C.) | Anneal time (min) | Thickness (nm) | ρ (Ω-cm) | $Q_{BD}$ (C/cm$^2$) |
|---|---|---|---|---|---|---|---|---|
| 8 | Hydrogen PLAD | 5000 2000-5000 | 8E16 | 400° C. | 30 | 51.49 | $1.05 \times 10^{15}$ | 1.7 |
| 9 | Hydrogen PLAD | 5000 2000-5000 | 8E16 | 500° C. | 30 | 51.30 | $1.59 \times 10^{15}$ | $7.0 \times 10^{-5}$ |

As shown in Table 1, measurement results of insulating properties of nine samples comprising a silicon oxide layer formed on a 300 mm p-type single crystal silicon substrate are disclosed. The silicon oxide layer in these samples are formed by the PECVD method at a temperature of about 400° C. and a pressure of about 1.8 Torr using tetraethyl orthosilicate (TEOS) and oxygen as source gases. Physical properties such as film thicknesses, resistivities (ρ), and breakdown charges ($Q_{BE}$) of the silicon oxide layer formed over the silicon substrate with or without the hydrogen PLAD processing are measured. In Sample 1, the silicon oxide layer formed over the silicon substrate is not processed by the hydrogen PLAD process. In Samples 2-5, the silicon oxide layer formed over the silicon substrate is processed by the hydrogen PLAD process, wherein implant energy is ramped from 2000-5000 eV at a fixed implant dosage of about 4E16 atoms/cm$^2$, and the silicon oxide layer is then annealed at different temperatures or not annealed. In Samples 6-9, the silicon oxide layer formed over the silicon substrate is processed by the hydrogen PLAD process, wherein implant energy is ramped from 2000-5000 eV at a fixed implant dosage of about 8E16 atoms/cm$^2$, and the silicon oxide layer is then annealed at different temperatures or not annealed.

According to the measurement results of the insulating properties of the silicon oxide layer in the various embodiments disclosed in Table 1, a resistivity of the silicon oxide layer in Sample 4 which was processed by the hydrogen PLAD process under an implant dosage of about 4E16 atoms/cm$^2$ and annealed under a temperature of about 400° C. for 30 minutes, increased by 2.2 times to that of the silicon oxide layer in Sample 1 which was not processed by the hydrogen PLAD process and annealed. In addition, a breakdown charge of the silicon oxide layer in Sample 4 which was processed by the hydrogen PLAD process under an implant dosage of about 4E16 atoms/cm$^2$ and annealed under a temperature of about 400° C. for 30 minutes, increased by about 50 times to that of the silicon oxide layer in Sample 1 which was not processed by the hydrogen PLAD process and annealed. Therefore, leakage current of the silicon oxide layer in Sample 4 was reduced and the electrical isolation property of the silicon oxide layer in Sample 4 was significantly improved by the hydrogen PLAD process and sequential annealing process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a dielectric layer with improved insulating properties, comprising:
   providing a dielectric layer having a first resistivity;
   performing a hydrogen plasma doping process to the dielectric layer, wherein the hydrogen plasma doping process is performed under an implant energy varying linearly during operation of the hydrogen plasma doping process; and
   annealing the dielectric layer, wherein the dielectric layer has a second resistivity greater than that of the first resistivity after annealing thereof.

2. The method as claimed in claim 1, wherein the dielectric layer comprises silicon oxide, undoped silicate glass (USG), borosilicate glass (BSG), phosphosilicate glass (PSG) or borophorphosilicate glass (BPSG).

3. The method as claimed in claim 1, wherein the dielectric layer has a first breakdown charge prior to the hydrogen plasma doping process and a second breakdown charge greater than that of the first breakdown charge after annealing thereof.

4. The method as claimed in claim 1, wherein the hydrogen plasma doping process is performed by a plasma doping (PLAD) ion implanter.

5. The method as claimed in claim 1, wherein the dielectric layer has a thickness of about 2-500 nm, and the hydrogen plasma doping process is performed under an implant energy of about 20-50000 eV and an implant dosage of about 1e16-1e17 /cm2.

6. The method as claimed in claim 1, wherein the dielectric layer comprises silicon oxide and the second resistivity is about 2.2 times greater than that of the first resistivity.

7. The method as claimed in claim 3, wherein the dielectric layer comprises silicon oxide and the second breakdown charge is about 50 times greater than that of the first breakdown charge.

8. A method for fabricating a semiconductor structure having a dielectric layer with improved insulating properties, comprising:
   providing a semiconductor substrate with a dielectric layer formed thereover, wherein the dielectric layer has a first resistivity;
   performing a hydrogen plasma doping process to the dielectric layer, wherein the hydrogen plasma doping process is performed under an implant energy varying linearly during operation of the hydrogen plasma doping process; and
   annealing the dielectric layer, wherein the dielectric layer has a second resistivity, after annealing thereof, that is greater than that of the first resistivity.

9. The method as claimed in claim 8, wherein the dielectric layer comprises silicon oxide, undoped silicate glass (USG), borosilicate glass (BSG), phosphosilicate glass (PSG) or borophorphosilicate glass (BPSG).

10. The method as claimed in claim 8, wherein the dielectric layer functions as an interlayer dielectric layer, an intermetal dielectric layer, or an isolation feature over the semiconductor substrate.

11. The method as claimed in claim 8, wherein the dielectric layer has a first breakdown charge prior to the hydrogen plasma doping process and a second breakdown charge greater than that of the first breakdown charge after annealing thereof.

12. The method as claimed in claim 8, wherein the hydrogen plasma doping process performed by a plasma doping (PLAD) ion implanter.

13. The method as claimed in claim 8, wherein the dielectric layer has a thickness of about 2-500 nm, and the hydrogen plasma doping process is performed under an implant energy of about 20-50000 eV and an implant dosage of about 1e16-1e17 /cm2.

14. The method as claimed in claim 8, wherein the dielectric layer comprises silicon oxide and the second resistivity is about 2.2 times greater than that of the first resistivity.

15. The method as claimed in claim 11, wherein the dielectric layer comprises silicon oxide and the second breakdown charge is about 50 times greater than that of the first breakdown charge.

16. The method as claimed in claim 1, wherein the implant energy is linearly ramped up in a predetermined interval during operation of the hydrogen plasma doping process.

17. The method as claimed in claim 8, wherein the implant energy is linearly ramped up in a predetermined interval during operation of the hydrogen plasma doping process.

* * * * *